Figure 1A:
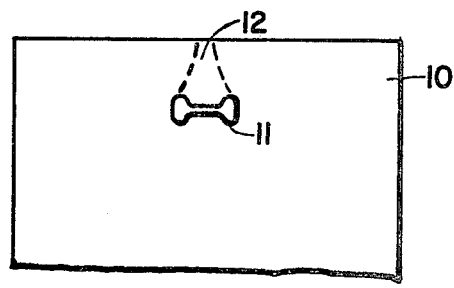

United States Patent [19]

Gurtler

[11] 4,199,397
[45] Apr. 22, 1980

[54] SPONTANEOUS GROWTH OF LARGE CRYSTAL SEMICONDUCTOR MATERIAL BY CONTROLLED MELT PERTURBATION

[75] Inventor: Richard W. Gurtler, Mesa, Ariz.

[73] Assignee: Motorola, Inc., Schaumburg, Ill.

[21] Appl. No.: 823,564

[22] Filed: Aug. 11, 1977

Related U.S. Application Data

[63] Continuation of Ser. No. 656,768, Feb. 9, 1976, abandoned.

[51] Int. Cl.² ............................................... B01J 17/12
[52] U.S. Cl. .............................. 156/620; 156/DIG. 88
[58] Field of Search ............... 156/DIG. 88, DIG. 84, 156/620, 617 H, 616 R; 422/250

[56] References Cited

U.S. PATENT DOCUMENTS

| | | | |
|---|---|---|---|
| 2,992,903 | 7/1961 | Imber | 156/DIG. 88 |
| 3,242,015 | 3/1966 | Harris | 156/616 |
| 3,258,314 | 6/1966 | Redwood | 422/250 |
| 3,341,361 | 9/1967 | Gorski | 156/DIG. 88 |
| 3,348,962 | 10/1967 | Grossman | 156/DIG. 88 |
| 3,600,237 | 8/1971 | Davis | 156/620 |
| 3,695,941 | 10/1972 | Green | 156/616 |
| 3,897,590 | 7/1975 | Gurs | 156/DIG. 88 |
| 3,944,640 | 3/1976 | Haggerty | 156/620 |
| 3,996,094 | 12/1976 | Lesk | 156/DIG. 88 |
| 4,120,743 | 10/1978 | Baghdadi | 156/DIG. 88 |

FOREIGN PATENT DOCUMENTS

99933 9/1973 German Democratic Rep. ..... 156/617 H

OTHER PUBLICATIONS

Lawson et al., Preparation of Single Crystals, Butterworth, Lauder, 1958, pp. 10 to 20.

Primary Examiner—Hiram H. Bernstein
Attorney, Agent, or Firm—John A. Fisher

[57] ABSTRACT

A polycrystalline semiconductor sheet may be converted to a macrocrystalline or monocrystalline semiconductor sheet through use of a controlled melt perturbation in the sheet. The process is initiated by formation of a small melt area generally in the center of the sheet of polycrystalline material and then by controlled sweeping motions a molten zone is ultimately formed across the entire width of the sheet. As the molten zone is allowed to solidify crystals of large size are formed, and with proper control of this crystal, can grow across the entire width of the polycrystalline sheet, or at least crystals of sufficiently large size for production of semiconductor activity may be produced.

Following formation of macrocrystalline material across the width of the sheet the perturbation may be continued throughout the process to sweep any dislocations or crystal boundaries to the edge of the sheet where they may be trimmed from the remainder of the material as desired. This process allows formation of a highly modified macrocrystalline semiconductor material without requiring use of a seed crystal.

3 Claims, 8 Drawing Figures

SPONTANEOUS GROWTH OF LARGE CRYSTAL SEMICONDUCTOR MATERIAL BY CONTROLLED MELT PERTURBATION

RELATED APPLICATIONS

This is a continuation of application Ser. No. 656,768, filed Feb. 9, 1976, now abandoned.

This invention is an improvement in the process disclosed in copending commonly assigned application Ser. No. 538,214 filed in the name of Israel A. Lesk on Jan. 2, 1975 and entitled "SILICON MANUFACTURE". It is also related to copending, commonly assigned application Ser. No. 645,857 filed by Baghdadi et al on Dec. 31, 1975. The present application is an improvement in carrying out such processes for the large scale production of semiconductor sheet material.

FIELD OF THE INVENTION

This invention relates to an improved process for converting a polycrystalline semiconductor sheet into a semiconductor sheet having a modified crystal structure suitable for solar cells for example.

More particularly, the invention relates to a conversion process of the type in which a molten zone is created in a small portion of a sheet of polycrystalline semiconductor material in order to convert the material to macrocrystalline semiconductor material.

More especially the invention relates to a method for substantially limiting dislocations and grain boundaries in a macrocrystalline semiconductor sheet as it is converted from a polycrystalline semiconductor sheet to a macrocrystalline semiconductor sheet.

DESCRIPTION OF THE PRIOR ART

As has been previously pointed out in the above referenced patent applications, there is a need for process capable of producing a large volume of semiconductor sheet material at very low cost in order to meet the projected demands in use for fabrication of semiconductor solar energy devices. Such devices can be projected as highly utilizable as alternative primary electrical energy generation facilities as a replacement for or as a supplement to present day conventional energy sources. The Czochralski method for growing ingots of single crystal semconductor material which is sliced, lapped and polished to produce thin wafers used in the fabrication of integrated circuits and other microelectronic devices is not suitable for this purpose because such techniques are too expensive.

Some proposals have been made for forming ribbon-like semiconductor sheet structures directly from a melt as in U.S. Pat. Nos. 3,096,158 and 3,393,002 but such techniques have not been found acceptable for practice in large volume production environments.

SUMMARY OF THE INVENTION

Accordingly, it is an object of this invention to provide a reliable method for inducing and maintaining the formation of large single cyrstals coextensive with a semiconductor sheet which method does not require the use of a seed crystal.

It is another object of the invention to use the dynamic growth characteristics of the liquid solid interface in the semiconductor sheet as an aid in forming and maintaining large crystal structures which may be propagated throughout the sheet.

It is a further object of the invention to use the dynamic growth characteristics of the liquid solid interface to induce the formation of large crystals in a semiconductor sheet and maintain such formation without substantial dislocations and defects by use of perturbation of the dynamic growth characteristics in the melt in a controlled manner.

The attainment of these and related objects may be achieved through use of a novel semiconductor sheet material conversion process herein disclosed. The process converts a polycrystalline semiconductor sheet to a macrocrystalline semiconductor sheet. A macrocrystalline structure is a structure in which the crystals are of sufficiently large size so as to permit semiconductor action; therefore a monocrystalline sheet, as used in the art, wherein the sheet is but a true single crystalline structure is encompassed within the term macrocrystalline.

To carry out the process a perturbation region having a small size as compared to the width of the starting sheet is rendered molten. The molten zone is preferably in the shape of a small bow-tie, or, for convenience, as used herein a bow shape. As the sheet is moved and a portion of the molten region is allowed to solidify, a single crystal of the semiconductor is formed in a portion of this small region and then the ends of this bow are extended until the molten region extends completely across the sheet. The foregoing procedure eliminates the need for starting with a single monocrystalline seed. Then the process may be continued as in the aforementioned referred to patent applications.

In accordance with a further preferred embodiment of the invention a new perturbation may be created near the center of the sheet near the molten zone and these perturbations swept to the sides of the sheet to create liquid solid interfaces wherein the growth vector sweeps dislocations and other defects to the sides of the sheet where they may be trimmed if desired.

While the process of the invention is particularly suited for use with polycrystalline silicon sheets used in the fabrication of silicon solar energy devices, other semiconductor material such as germanium, compound semiconductors, such as gallium arsenide, cadmium sulfate and the like may be employed as well. The region of the sheet at which the perturbation is started may be at the center of the sheet but it will be understood that for certain purposes starting at an offset portion thereof or even at the edge of the sheet may be perferred.

THE DRAWINGS

Figure 1B:
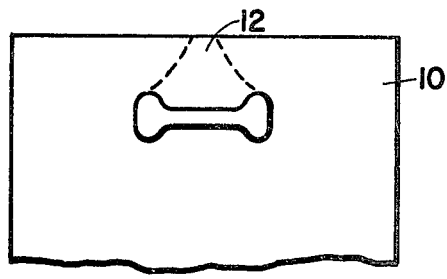
Figure 1C:
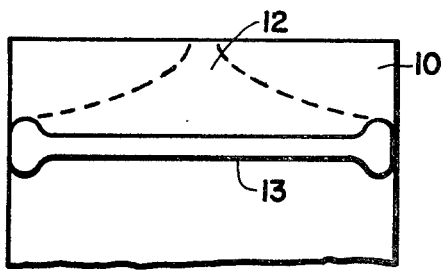

Further objects and advantages of the invention will be understood from the following complete description thereof and from the drawings wherein:

FIGS. 1a–c are plan views of a semiconductor ribbon showing the initiation of a macrocrystalline structure within a polycrystalline sheet.

Figure 2:
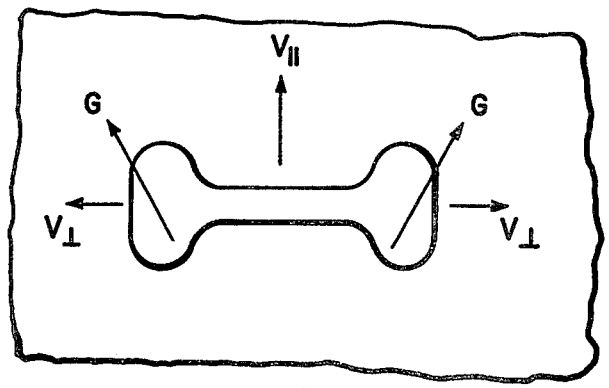
Figure 3:
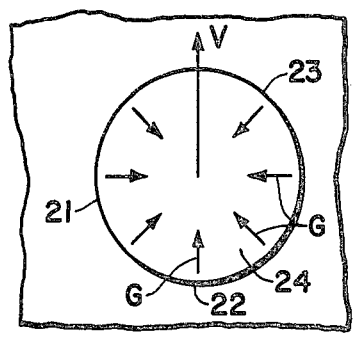
Figure 4A:
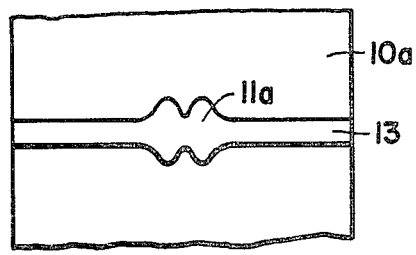
Figure 4B:
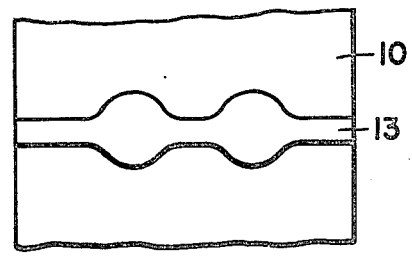
Figure 4C:
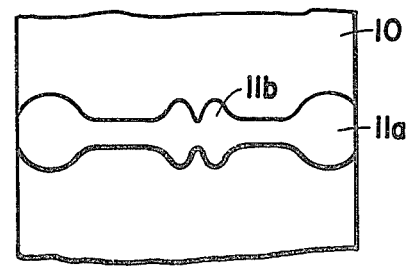

FIGS. 2 and 3 are schematic plan views showing vector diagrams to better explain the operation of the dynamic vectors being utilized; and FIGS. 4a–c are plan views of successive stages in a further embodiment of the invention.

COMPLETE DESCRIPTION OF THE DRAWINGS

In the well known Czochralski method of producing monocrystalline semiconductor material, a monocrystalline seed of small size is dipped into a melt of the semiconductor material and slowly withdrawn thereby producing similar monocrystalline material. The crystal continues to expand into an ingot of sufficient size e.g., two or three inches, and then the pull is continued until an ingot of some length is produced. The length is limited by the size of the apparatus; a typical length being approximately three feet. If, during the pulling process, the solidified material loses the monocrystalline orientation there is no way the that the orientation can be regained and the pulling process will be stopped at whatever length has been obtained before the orientation was lost. As has been noted herein before, this process is time consuming and hence expensive. For the production of a continuous sheet of macrocrystalline or monocrystalline semiconductor material in sheet or web form in a continuous process, it has been found that it is not necessary that all of the polycrystalline semiconductor material be converted to a single crystal but only that sufficient of the material converted to large areas of volumes of monocrystalline-like (macrocrystalline) material sufficient to be treated to produce semiconductor action. It is further important that a process be utilized which, if the orientation in the continuously moving web is lost it can be restored and, in accordance with a further embodiment of this invention, can be, in fact, restored on a continuous basis.

As shown in FIG. 1, a polycrystalline semiconductor sheet or web 10 has a localized molten zone 11 formed therein. The localized molten zone has a cross-sectional shape resembling that of the cross-sectional shape of a bow-tie and shall be referred to hereinafter as a bow-shape. For clarification of explanation of the process the crystalline web 10 has been depicted as having had some upward travel thereby indicating a monocrystalline semiconductor region 12 which has solidified from the molten zone, as it has preferentially taken the orientation of a single crystal.

As shown in FIG. 1b, with continued travel of the sheet 10, the bow molten zone 11 has been increased in size to extend further across the width of the web. This process is continued by increasing the scan of the directed energy until the generally spherical perturbations on the ends of the bow extend the full width of the sheet (FIG. 1c), with the macrocrystalline solidified region 12 increasing accordingly until the molten region 13 extends completely across the sheet 10. Thereafter the process may be continued as in the aforementioned referred to patent applications.

The bow-shape of the molten region 11 may be accomplished by either modifying the timing of the scan of the laser or electron beam energy directed thereon or by modulating the power of the laser or electron beam. For example, if the scan of the energy beam is halted at each end of the scan more energy (time-wise) will be directed at the end regions. Alternately, if the scan is kept at the same frequency and the power modulated to increase at each end of the scan, the same bow-shaped molten zone will be achieved in accordance with the invention.

To better understand the growth dynamics of the process an enlarged view of molten region 11 is shown in FIG. 2 with vectors V ∥ and V⊥ indicated thereon. At the ends of the bow-shaped molten region the growth direction will be the composite of the two velocity vectors resulting in the growth vectors G. As will be understood, a consideration of the growth dynamics indicates that the growth direction is parallel to the phase normal. Since we must consider the movement of the web we arrive at a growth velocity which is given by:

$$V_G = \vec{G} \cdot \vec{V}$$

where V=the velocity vector of the center of the growth melt.

As a further example of this consideration, a circular melt as depicted in FIG. 3, wherein the vector V is still the velocity vector for the movement of the web and the G vectors are the growth vectors as the molten zone would solidify. Thus, the growth velocity at 21 is given by:

$$\vec{G} \cdot \vec{V} = 0$$

Growth at 22 is equal to:

$$\vec{G} \cdot \vec{V} = V$$

At points 24 and 23 the growth velocity is approximately given by:

$$\vec{G} \cdot \vec{V} \approx \pm 0.707 V$$

respectively; a negative velocity implies melting while a positive velocity implies freezing or crystal growth.

This indicates that the outward expanding circular regions on the standard melt region would have a velocity equal to:

$$V_G = \vec{G} \cdot (\vec{V} + \vec{V}_\perp) \text{ which, if}$$

$$|\vec{V}_\parallel| \simeq |\vec{V}_\perp|.$$

where $\vec{V}_\perp$ = the velocity vector toward the sides of the melt implies that almost all regions of the enchanced regions have an outward (toward edge) growth, velocities that are enhanced over that of inward propagation.

An obvious extrapolation is that where the vertical velocity is equal to zero than a rapid propagation of the central region to the edge occurs. Thus, the process can be repeated ad infinitum until single crystal material results. However, as a practical matter, the velocity in the vertical direction should not be zero because on the next initiation of the sequence it is desirable that the melting occur in previously melted areas which would not occur if in fact there were no vertical movement. It should be noted that a large curvature for the spherical zones at the ends of the bow-shape is not necessary. High lateral velocities of the scan and a large number repetitions relative to the vertical velocity will insure successful operation.

From the above it should be noted that a further embodiment of the invention assures that no loss of continuity of the macrocrystalline structure will occur since a repetition of the foregoing procedure can be utilized continuously throughout the process by recreating in the linear molten zone which is operating in the process a new bow shape 11a (FIG. 4a) in the center of the molten zone which can be swept to the edges of the web (FIG. 4b) continuously. As the spherical shapes reach the edge of the web a new bow-shape molten zone 11b (FIG. 4c) can be created, etc. to continue the process.

It should be apparrent that a process capable of achieving the stated objects of the invention has been provided as process allows the conversion of polycrystalline silicon to macrocrystalline silicon material without the use of seed crystal. Once the macrocrystalline material has been formed the process is further utilizable in maintaining a continuous control of the macrocrystalline material to assure that continuous operation of the process can be utilized. As a result, macrocrystalline material suitable for fabrication of solar energy devices and other semiconductor devices can be obtained at a low cost high volume process. By the foregoing it will be further seen the many advantages of the process over the batch processing of, for example, a Czochralski puller.

It should be readily apparent to the one skilled in the art that various changes can be made in the process as described above. It is intended that such changes be covered within the spirit and scope of the invention described herein:

What is claimed is:

1. In a continuous process for converting a polycrystalline semiconductor sheet to a macrocrystalline sheet which comprises the steps of:
    heating said polycrystalline sheet to form a molten region of small width as compared to the width of said sheet, said molten region having enlarged molten regions at each end thereof;
    moving said sheet to allow said molten region to travel lengthwise along said sheet while extending the width of said molten region and maintaining said enlarged molten regions at the ends thereof;
    continuing to extend the width of said molten region until coextensive with the width of said sheet; and
    allowing said sheet to solidify into macrocrystalline material as said molten region passes lengthwise along it, the improvement comprising continuously creating additional small width molten regions having enlarged molten regions at each end thereof, said additional regions created centrally of the previously extended molten region as the edges of the previous enlarged molten regions extend to the sides of said sheet, and extending said additional molten regions laterally outwardly along said traveling molten region to the sides of said sheet.

2. The process of claim 1 wherein said molten region having an extended width is shaped to have a linear central portion and shaped end portions whereby growth vectors associated with said shaped end portions sweep defects to the sides of said sheet.

3. The process of claim 2 wherein said shaped end portions have a substantially circular shape.

* * * * *